（12）United States Patent
Utzny

(10) Patent No.: US 8,932,785 B2
(45) Date of Patent: Jan. 13, 2015

(54) EUV MASK SET AND METHODS OF MANUFACTURING EUV MASKS AND INTEGRATED CIRCUITS

(71) Applicant: Advanced Mask Technology Center GmbH & Co. KG, Dresden (DE)

(72) Inventor: Clemens Utzny, Dresden (DE)

(73) Assignee: Advanced Mask Technology Center GmbH & Co. KG, Dresden (DE)

( * ) Notice: Subject to any disclaimer, the term of this patent is extended or adjusted under 35 U.S.C. 154(b) by 65 days.

(21) Appl. No.: 13/652,987

(22) Filed: Oct. 16, 2012

(65) Prior Publication Data

US 2014/0106263 A1 Apr. 17, 2014

(51) Int. Cl.
*G03F 1/22* (2012.01)
*G03F 1/72* (2012.01)

(52) U.S. Cl.
USPC ................................ 430/5; 430/311; 430/394

(58) Field of Classification Search
CPC ................ G03F 1/22; G03F 1/84; G03F 7/20
USPC .................................. 430/5, 22, 30, 311, 394
See application file for complete search history.

(56) References Cited

U.S. PATENT DOCUMENTS

2004/0142251 A1* 7/2004 Hsu et al. ............................ 430/5
2011/0318672 A1* 12/2011 Ogadhoh et al. .................. 430/5

* cited by examiner

*Primary Examiner* — Stephen Rosasco
(74) *Attorney, Agent, or Firm* — Dicke, Billig & Czaja, PLLC

(57) ABSTRACT

An EUV mask set and method of manufacturing is disclosed. In one embodiment, a set of EUV mask blanks is inspected to obtain information about defects in each of the EUV mask blanks. From the obtained information, a set of complementary functional portions is determined, wherein each functional portion is assigned to one of the EUV mask blanks and does not contain any of the defects. The functional portions of the EUV mask blanks of the EUV mask blank set complement one another to form a virtual image area corresponding in size to image areas of the EUV mask blanks. A predefined mask pattern is provided on the EUV mask blanks. Information identifying position and shape of the functional portions is used to control an illumination process for imaging the predefined mask pattern onto a target.

20 Claims, 10 Drawing Sheets

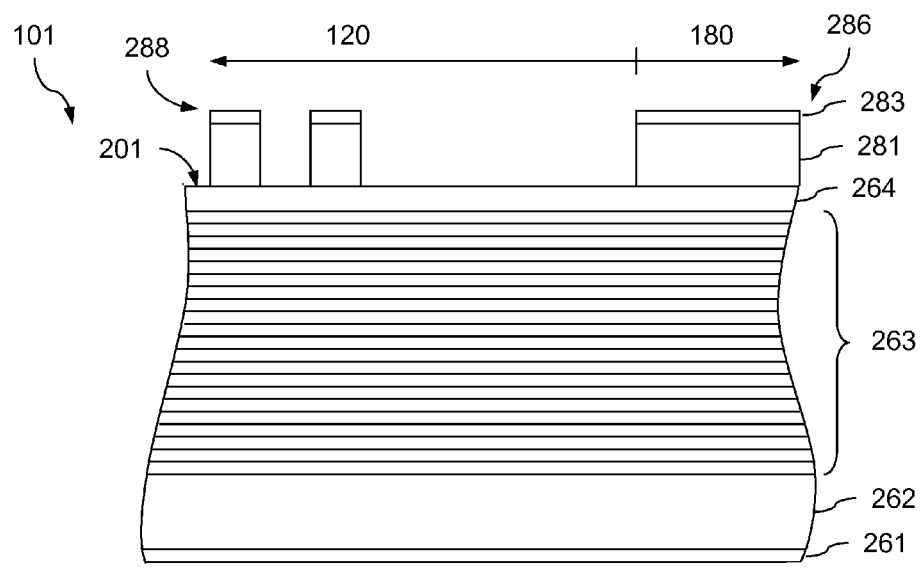
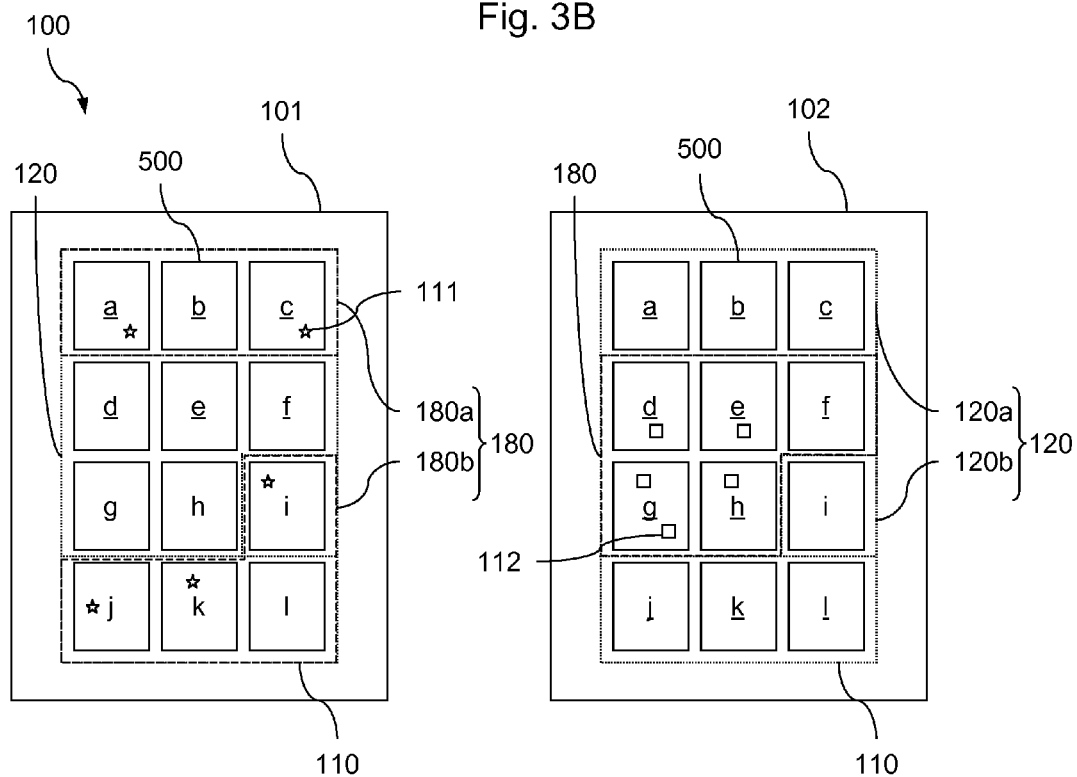

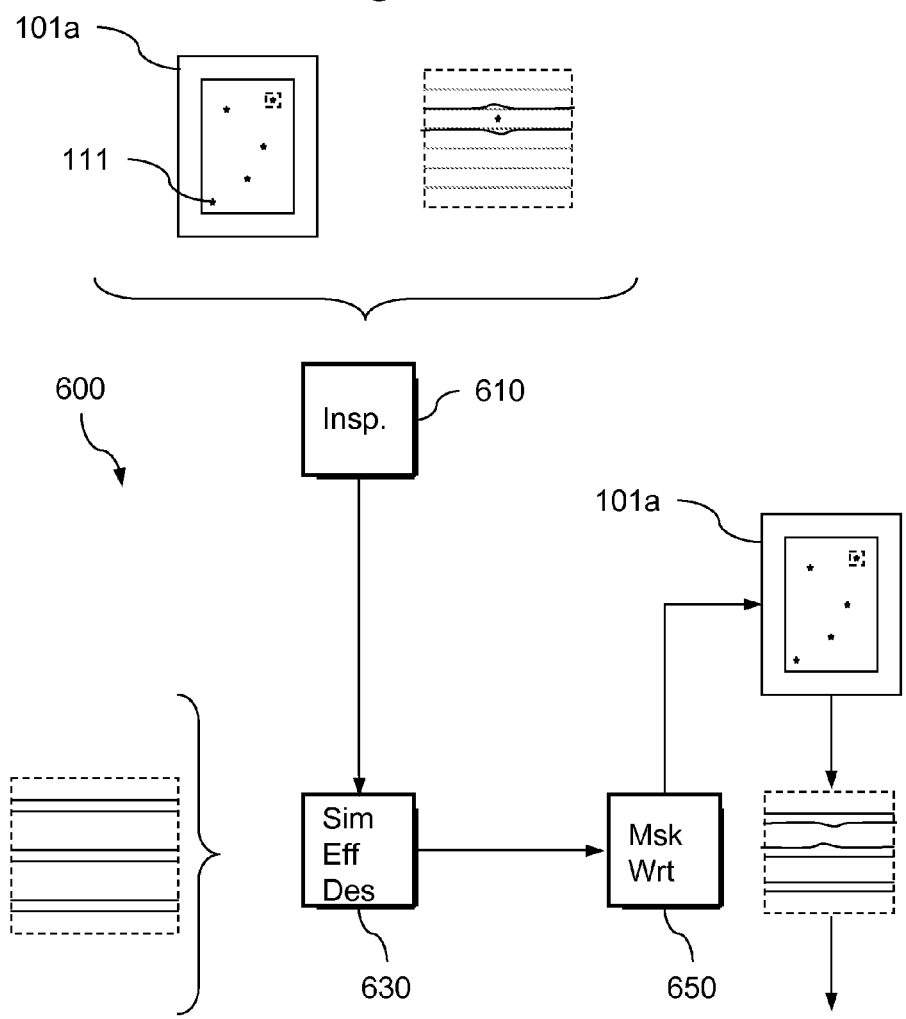

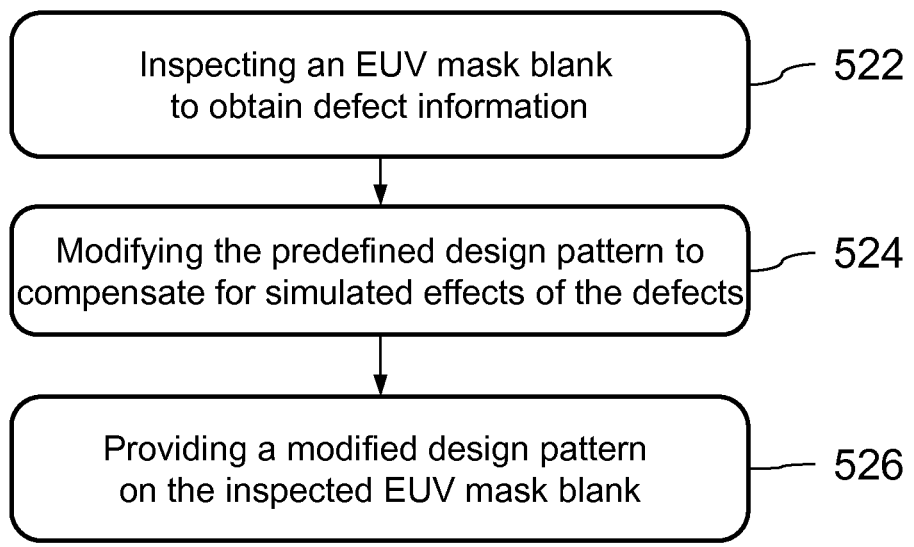

EUV MASK SET AND METHODS OF MANUFACTURING EUV MASKS AND INTEGRATED CIRCUITS

BACKGROUND

EUV (Extreme Ultraviolet) lithography uses radiation in the spectral range between 10 and 15 nm, which is strongly absorbed in solid state bodies and requires reflective optics. A photolithographic mask for employing EUV lithography relies on a multilayer reflector deposited on a polished substrate. Typical multilayer reflectors include 40 or more layer pairs with a molybdenum layer and a silicon layer. It is difficult to produce defect free multilayer reflector masks. On the other hand, defects in the multilayer reflector are difficult to repair. Conventionally, mask blanks can be used despite of defects, when a defined mask pattern can be aligned to the defects in a way such that the defects do not print on a target on which the mask is imaged. Absorber structures defining the mask pattern can be locally reworked to compensate for such defects that otherwise would print on the target. It is desirable to further reduce the costs of EUV lithography.

For these and other reasons, there is a need for the present invention.

SUMMARY

According to an embodiment related to a method of manufacturing an EUV mask set, a set of EUV mask blanks is inspected to obtain information about defects in each of the EUV mask blanks of the EUV mask blank set. From the obtained information, a set of complementary functional portions is determined, wherein each functional portion is assigned to one of the EUV mask blanks and does not contain any of the defects. The functional portions of the EUV mask blanks complement one another to form a virtual image area corresponding in size to image areas of the EUV mask blanks. A predefined mask pattern is provided on the EUV mask blanks. Information identifying position and shape of the functional portions is used to control an illumination process for imaging the predefined mask pattern onto a target.

According to an embodiment related to a method of manufacturing integrated circuits, an EUV mask set is provided, wherein each EUV mask of the EUV mask set comprises an idle portion and a functional portion which complement one another to form an image area. The functional portions of the EUV masks complement one another to form a virtual image area. Each of the functional portions include a portion of a predefined mask pattern. The portions of the predefined mask pattern complement one another to form the predefined mask pattern. A target is sequentially exposed with the EUV masks of the EUV mask set, wherein the predefined mask pattern is imaged into an EUV sensitive layer provided on the target.

Another embodiment provides an EUV mask set. Each EUV mask of the EUV mask set comprises an idle portion and a functional portion complementing one another to form an image area. Each functional portion includes a portion of a predefined mask pattern. The portions of the predefined mask pattern of the EUV mask set complement one another to form the predefined mask pattern. Each functional portion is free of such defects that would print on a target.

According to a further embodiment, a method of manufacturing an EUV mask includes inspecting an EUV mask blank to obtain information about defects in the EUV mask blank. The predefined design pattern is modified to compensate for the simulated effects of the defects. The modified design pattern is provided on the inspected EUV mask blank.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated, as they become better understood by reference to the following detailed description.

FIG. 3A is a schematic cross-sectional view of an EUV mask in accordance with an embodiment providing absorber patterns covering idle portions.

FIG. 3B is a schematic plan view on two complementary EUV masks in accordance with an embodiment related to parting lines along die boundaries.

FIG. 4A is a schematic block diagram for illustrating an apparatus for performing a method of manufacturing an EUV mask according to an embodiment providing pattern adjustment.

FIG. 5C is a simplified flowchart of a method of manufacturing an EUV mask in accordance with an embodiment related to pattern adjustment.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" are open and the terms indicate the presence of stated structures, elements or features but not preclude additional elements or features. The articles "a", "an" and "the" are intended to include the plural as well as the singular, unless the context clearly indicates otherwise.

Figure 1A:
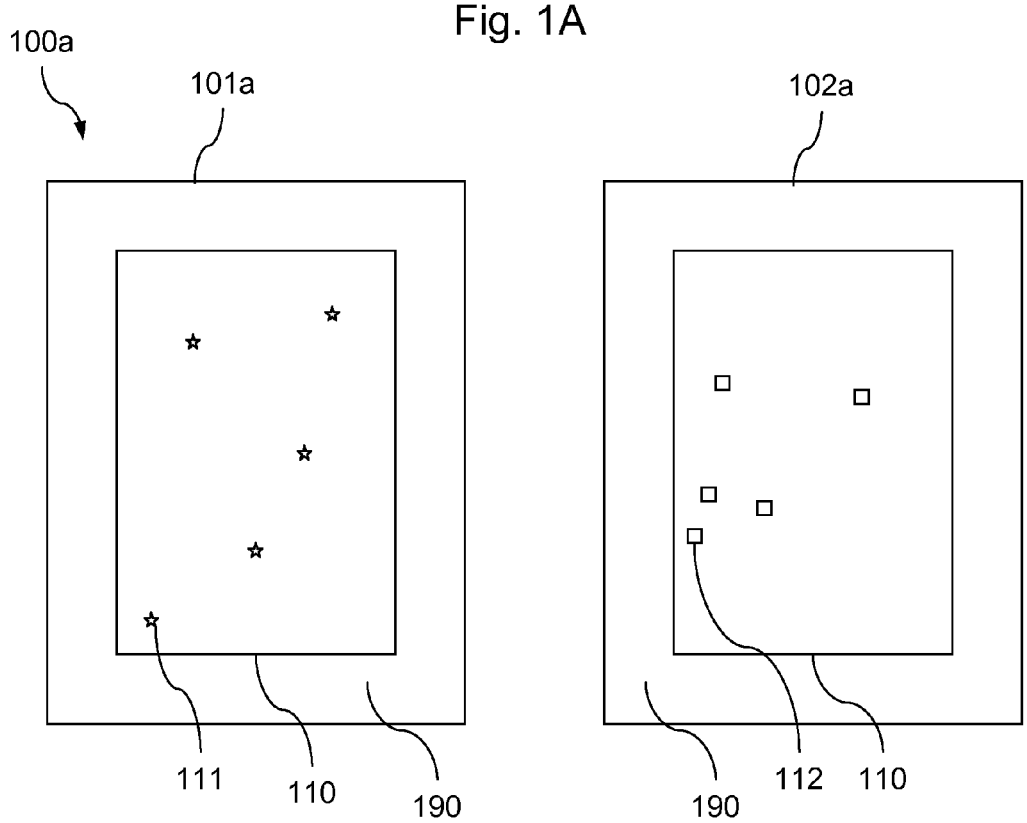
FIG. 1A is a schematic plan view of two EUV mask blanks with defects.
Figure 1B:
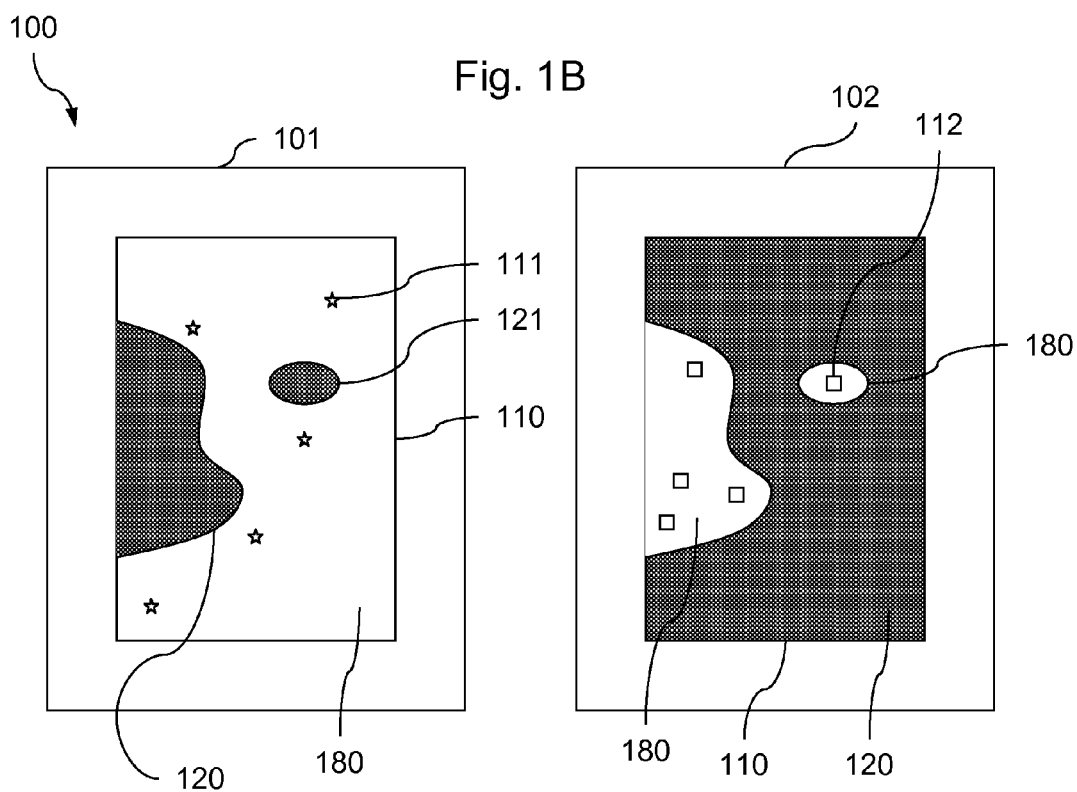
FIG. 1B is a schematic plan view of two complementary EUV masks based on the EUV mask blanks of FIG. 1A.
Figure 1C:
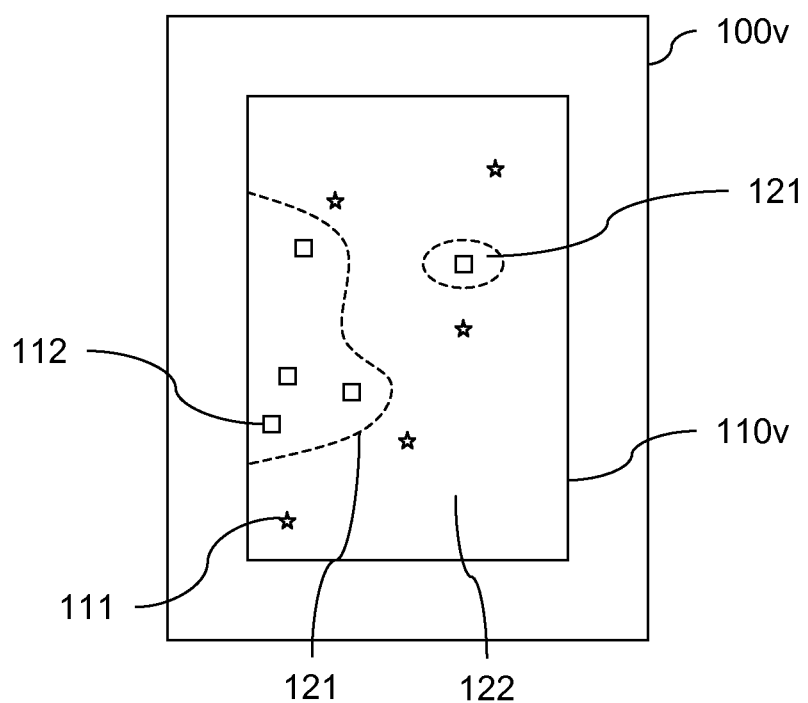
FIG. 1C illustrates a virtual image area of two functional portions of the two complementary EUV masks of FIG. 1B.

FIGS. 1A to 1C refer to a method of manufacturing a set 100 of complementary EUV masks 101, 102. A set 100a of EUV mask blanks 101a, 102a is inspected to obtain information about defects within an image area 110 in each of the EUV mask blanks 101a, 102a. Generally, a defect is anything that results in a local deviation of reflectivity of the respective EUV mask blank 101a, 102a, which have a homogeneous, uniform reflectivity in the defect-free case. Defects may be introduced into the EUV mask blank 101a, 102a by surface blemish or particle contamination on a substrate on which a multilayer reflector is deposited, within the multilayer reflector, or any other disturbance within the multilayer reflection stack. In the following the term defects refer to such defects that reduce the allowable process window for an exposure by 10% or more. A "printing defect" is a defect that without further countermeasures would print with not negligible probability on a target such that a pattern obtained by illuminating the target with the defective EUV mask deviates from a target pattern defined by the predefined mask pattern.

The EUV mask blanks 101a, 102a may be inspected using optical inspection evaluating reflected light or actinic inspection using the EUV wavelength. At least information about the position of the defects may be obtained for each EUV mask blank 101a, 102a. According to other embodiments, the defect information contains additional information concerning the size of the defect and its assumed effect on phase and/or amplitude of reflected EUV radiation.

FIG. 1A illustrates two EUV mask blanks 101a, 102a with imaging areas 110. Each imaging area 110 defines an exposure field scanned in the EUV lithography apparatus and imaged onto a target. A frame area 190 surrounds the image area 110.

The image areas 110 of both mask blanks 101a, 102a have the same size. The first EUV mask blank 101a on the left hand side includes first defects 111 in the image area 110. Information describing at least the position of the first defects 111 is obtained. Accordingly, for a second EUV mask blank 102a illustrated on the right hand side second defects 112 are detected in the image area 110. At least positional information describing the position of the second defects 112 within the image area 110 is obtained. From the obtained positional information a complementary set of functional portions 121, 122 is determined. The functional portions 121, 122 are provided with corresponding portions of a predefined mask pattern to obtain an EUV mask set 100 with complementary EUV masks 101, 102.

FIG. 1B illustrates the complementary functional portions 120 of the two EUV masks 101, 102 obtained from the EUV mask blanks 101a, 102a of FIG. 1A. A functional portion 120 is assigned to the first EUV mask 101 and includes partial areas of the image area 110 without any of the first defects 111. The functional portion 120 may be a one-part area or may have two or more spatially separated areas as illustrated.

Another functional portion 120 is assigned to the second EUV mask 102 and extends over portions of the image area 110 without any of the second defects 112. The functional portions 120 of all EUV masks 101, 102 of a set 100 of complementary EUV masks complement one another to a virtual image area 110v having the size of the image areas 110 of the EUV masks 101, 102. Information about shape and position of the functional areas 120 may be stored.

FIG. 1C combines the functional portions 121, 122 of the two EUV masks 101, 102 of FIG. 1B. The functional portions 121, 122 complement one another to form a virtual image area 110v of a virtual mask 100v. Within a first functional portion 121, the first mask 101 is free of defects and can be used to illuminate a target with a corresponding portion of a predefined mask pattern. Within the second functional portion 122 the second mask 102 is free of defects and can be used to illuminate a target device with the complementary part of the predefined mask pattern. The functional portions 121, 122 do not overlap with each other. The two defective EUV masks 101, 102 can substitute one defect free EUV mask.

EUV mask blanks are extremely expensive. The production of defect free EUV mask blanks is a considerable challenge. Conventionally, for obtaining one defect free mask a plurality of identical masks have to be produced, wherein the majority of the produced masks is unusable even when floor planning approaches are applied. The embodiments allow the use of such EUV mask blanks that are currently unusable even for approaches aiming at hiding the defects below absorber patterns of the predefined mask pattern. Hence fewer masks have to be produced for providing a mask set effective as a virtual defect free mask. A considerable economical benefit is achieved. The embodiments may be combined with conventional reticle floor planning approaches.

Referring back to FIG. 1B, for each EUV mask 101, 102 an idle portion 180 may be identified, wherein the functional and the idle portions 120, 180 of each EUV mask 101, 102 complement one another to cover completely and without overlay the respective image area 110.

According to an embodiment, the EUV masks 101, 102 are provided with a contiguous absorber structure in the idle portions 180. For example, an absorber layer may be deposited to cover at least the image areas 110 of the EUV mask blanks 101a, 102a. Within the functional portions 120, the respective corresponding portion of the predefined mask pattern is provided, for example by a selective exposure of an electron beam sensitive layer with an electron beam leaving the absorber layer unpatterned in the idle portion 180. The unpatterned section of the absorber layer forms the absorber structure in the idle portion 180.

According to other embodiments, each of the EUV masks 101, 102 may be provided with the complete predefined mask pattern and portions of a further absorber layer may cover the absorber pattern in the idle portions.

According to the illustrated embodiment, the set 100 of complementary EUV masks is a set of two EUV masks 101, 102. According to other embodiments, the set 100 of complementary EUV masks may be a set of three or more EUV masks.

Figure 2:
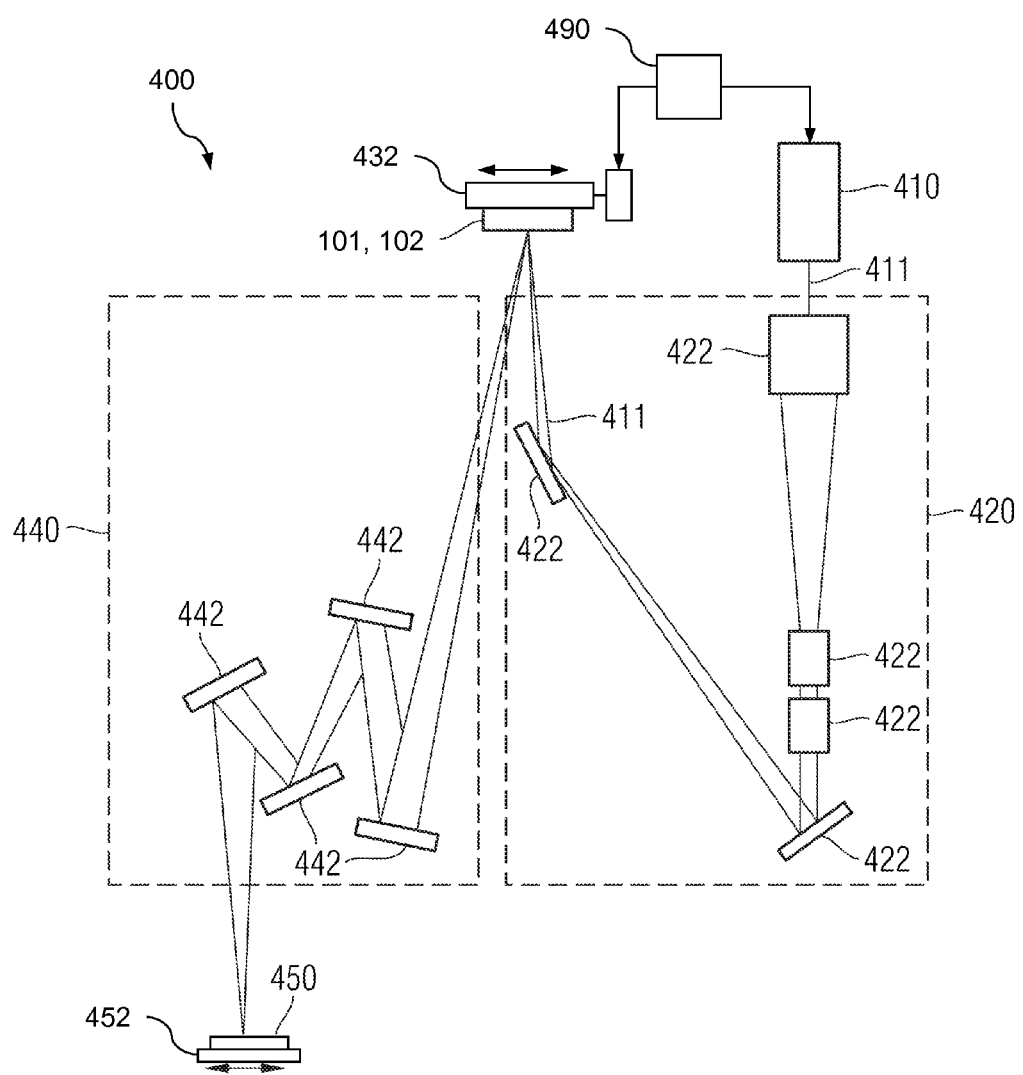
FIG. 2 is a schematic illustration of an EUV lithography apparatus for illustrating a method of manufacturing an integrated circuit according to another embodiment.

FIG. 2 shows an EUV lithography apparatus 400 for manufacturing integrated circuits using a set of complementary EUV masks 101, 102. A radiation source 410 produces radiation used for EUVL (EUV lithography), for example extreme ultraviolet radiation having a wavelength of 13.5 nanometer. A condenser system 420 guides the radiation emitted from the radiation source 410 to an EUV mask 101 which may be mounted on a mask stage 432. The condenser system 420 includes condenser optics 422, e.g. mirrors, which are reflective at the radiation wavelength and which collect and focus the radiation onto the EUV mask 101. The condenser system 420 may include a plurality of condenser optics 422. The radiation impinges on the EUV masks 101, 102 as illumination beam 411. The mask stage 432 moves the EUV mask 101 during an illumination period along a scan direction. The illumination beam 411 scans at least the image area 110 of the EUV mask 101.

A projection system 440 images the pattern of the EUV mask 101 onto a target 450. The target 450, which may be a semiconductor wafer for manufacturing integrated circuits, is coated with a resist layer, which is sensitive to the radiation of the illumination wavelength. The projection system 440 includes reflective projection optics 442, e.g. mirrors, that project radiation reflected from the EUV masks 101, 102 onto the target 450 true to scale or scaled down. A stepper 452 may move the target 450 along two orthogonal directions such that the same EUV mask 101, 102 sequentially illuminates different regions on the target 450.

According to an embodiment providing complementary idle portions 180 covered by an absorber structure, a first EUV mask 101 of an EUV mask set 100 is installed in an EUVL apparatus and regularly and completely scanned to image a portion of the predefined mask pattern corresponding to the functional portion 120 of the first EUV mask 101 onto the target 450. Then the first EUV mask 101 is replaced with a further EUV mask 102 of the same EUV mask set 100. With the second EUV mask 102 the exposure of the same target 450 is continued, wherein the portion of the predefined mask pattern according to the functional portion 120 of the second EUV mask 102 is imaged to the same target 450. After the second EUV mask 102 of the EUV mask set 100 has been completely scanned, the second EUV mask 102 may be replaced with a further EUV mask of the same EUV mask set 100. The target 450 is sequentially illuminated with all EUV masks 101, 102 of the EUV mask set 100.

According to another embodiment, a control unit 490 of the lithography apparatus 400 controls a movement of the mask stage 432 such that the illumination beam 411 does not reach the idle portions 180 of the respective EUV mask 101, 102. Based on information describing position and shape of the functional portions 120 the mask stage 432 scans only the functional portions 120 such that a total exposure time is reduced. According to a further embodiment, the control unit 490 may control the radiation source 410 to blank the radiation 411 for the periods of time where the illumination beam 411 crosses the idle portions 180.

The EUV mask set 100 used in the lithography apparatus 400 may include at least two, e.g. three or more EUV masks. Each EUV mask 101, 102 of the same EUV mask set 100 includes an idle portion 180 and a functional portion 120, wherein the functional portions 120 of the EUV masks 101, 102 assigned to the same EUV masks set 100 complement one another to form a predefined mask pattern. On each EUV mask 101, 102 the functional portion 120 and the idle portion 180 complement one another to form the image area 110.

According to the embodiment of FIG. 3A, an EUV mask 101 may include a base substrate 262 having a low thermal expansion coefficient, for example a glass having a thickness of 5 to 10 millimeter. On the base substrate 262 a multilayer reflector 263 is formed and includes forty or more bilayers, wherein each bilayer includes a molybdenum and a silicon layer. The pitch of the bilayers may be about 7 nanometer. A capping layer 264 e.g. a ruthenium Ru or silicon Si layer, covers the multilayer reflector 263. The thickness of the capping layer 264 may be between 1 and 5 nanometer. On the capping layer 264 absorber structures 286, 288 may be formed, wherein each absorber structure 286, 288 includes a stack comprising an absorber material 281, for example TaBO, TaBN, TaNO, TaN and an anti-reflective coating material 283, e.g. silicon oxynitride. A conducting layer 261 may cover the rear side.

According to the illustrated embodiment, in the idle portion 180 a contiguous absorber structure 286 without openings covers the multilayer reflector 263 approximately completely. The absorber pattern 288 in the functional portion 120 forms a portion of the predefined mask pattern.

According to other embodiments the idle portion 180 may include a corresponding absorber pattern 288 of the predefined mask pattern and an additional absorber structure 286 covers the absorber structures formed in the idle portion 180. According to yet a further embodiment, the EUV mask 101 may include trenches etched into the multilayer 263 from a front surface 201 instead of the absorber structures 286.

FIG. 3B shows an EUV mask set 100 consisting of two EUV masks 101, 102. Each of the EUV masks 101, 102 of the EUV mask set 100 has an image area 110 with an idle portion 180 and a functional portion 120. Each functional portion 120 includes an absorber pattern defining a portion of a predefined mask pattern. Each idle portion 180 may or may not include a not-patterned absorber structure. The portions of the predefined mask pattern assigned to the two functional portions 120 of both EUV masks 101, 102 complement one another to form the complete predefined mask pattern. On each EUV mask 101, 102 the respective functional portion 120 is free of any printing defects, e.g. defects in non-absorbing mask sections in the vicinity of an absorber pattern. The embodiment can be combined with known floor planning approaches such that some non-printing defects may be hidden below absorber structures or may have sufficient distance to non-critical absorber patterns.

The predefined mask pattern may include a plurality of identical functional areas 500, each functional area 500 assigned to a semiconductor die and spatially separated from the neighbouring functional areas 500. According to the illustrated embodiment, the number of identical functional areas 500 is 12. According to other embodiments, the number of identical functional areas 500 may be lower or significantly higher. The functional areas 500 may be arranged in rows and columns to form an orthogonal matrix. The shape of the idle and functional portions 120, 180 in both EUV masks 101, 102 is determined such that both the idle and the functional portions 180, 120 include only complete functional areas 500. Functional areas 500 which are defective on the first EUV mask 101, i.e. functional areas a, c, i, j, k are assigned to the functional portion 120 of the second mask 102. Functional areas 500 which are defective on the second mask 102, i.e. functional area d, e, g, h are assigned to the functional portion 120 of the first mask 101. Functional areas 500 with defects neither on the first nor on the second mask 101, 102 may be assigned to either the first or the second mask 101, 102. In the illustrated embodiment, functional areas b and l are assigned to the functional portion 120 of the second mask 102 and the functional area f is assigned to the functional portion 120 of the first mask 101. On each of the EUV masks 101,102 an idle portion 180 complements with the respective functional portion 120 to form the image area 110. Each functional portion 120 may be a connected area or may include two or more spatially separated sub-areas 120a, 120b. Each idle portion 180 may be a connected area or may include two or more spatially separated sub-areas 180a, 180b. The parting lines between the idle portions 180 and the functional portions 120 may run in mask sections corresponding to die boundaries, e.g. kerf areas, separating semiconductor dies of integrated circuits obtained by exposing a semiconductor substrate using the EUV mask set 100.

The EUV mask set 100 including the EUV masks 101, 102 may be provided together with information about position and shape of the functional portions 120 and/or idle portions 180 to an EUV lithography apparatus. The information is used to control a mask stage controlling the scanning of the masks 101, 102 in the lithography apparatus 400 of FIG. 2A. Using the information, the mask stage may move the EUV masks 101, 102 in a way such that the idle portions 180 are not scanned. According to other embodiments, absorber structures cover the idle areas 180 respectively.

Figure 3C:
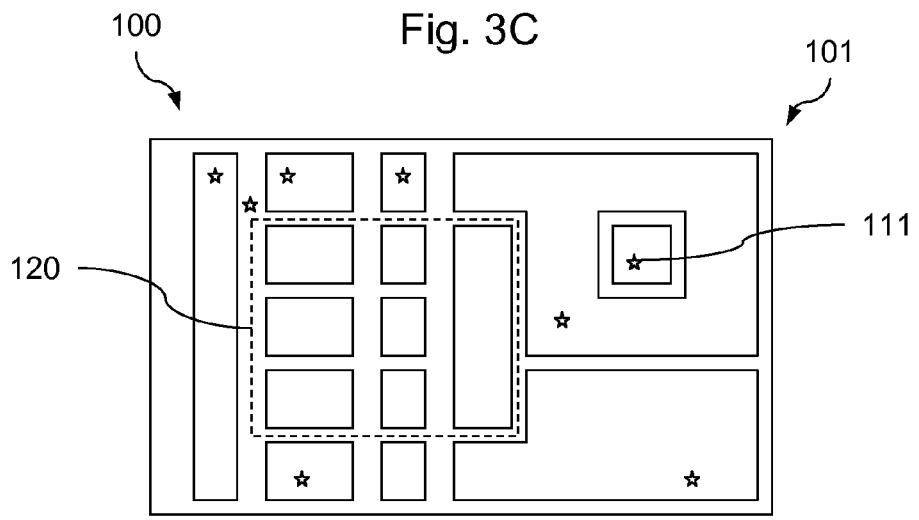
FIG. 3C is schematic plan view on a set of complementary EUV masks in accordance with an embodiment related to parting lines along edges of spatially separated pattern blocks.
Figure 3C:
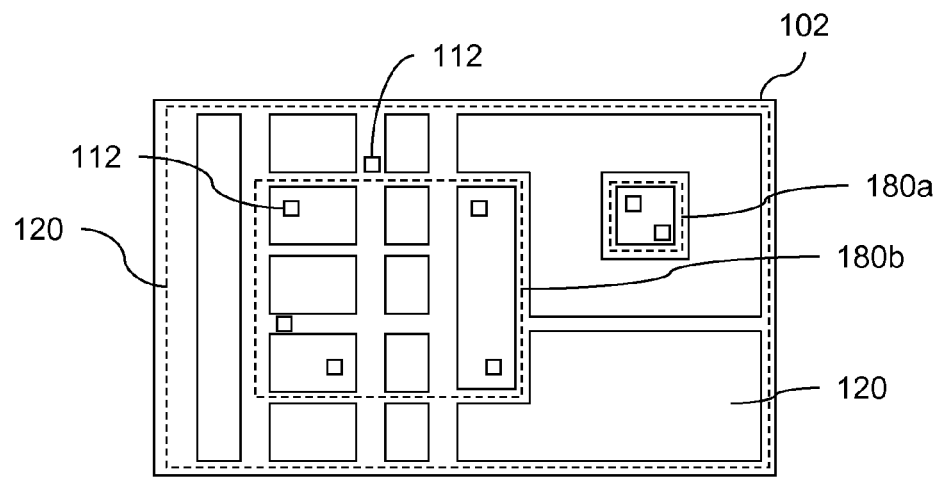
Figure 3C:
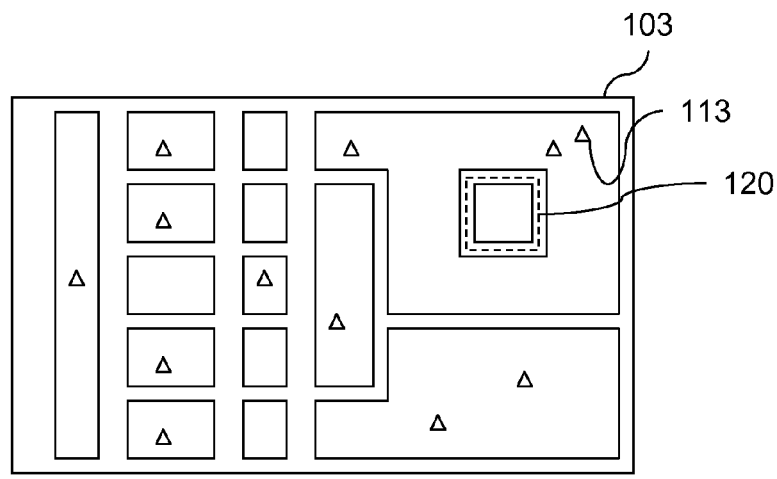

FIG. 3C refers to an EUV mask set 100 consisting of three EUV masks 101, 102, 103. Each of the EUV masks 101, 102, 103 carries at least a portion of a predefined mask pattern. According to an embodiment, each of the EUV masks 101, 102, 103 may carry the complete predefined mask pattern. The predefined mask pattern includes several spatially separated pattern blocks. On each EUV mask 101, 102 parting lines between idle portions 180 and functional portions 120 run between edges of pattern blocks. The pattern blocks may correspond to functional units of integrated circuits obtained by exposing a semiconductor substrate using the EUV mask set 100. According to a preferred embodiment, the parting lines separating idle and functional portions 180, 120 run along two orthogonal directions, wherein one of the directions corresponds to a scan direction in an EUV lithography apparatus.

Figure 4B:
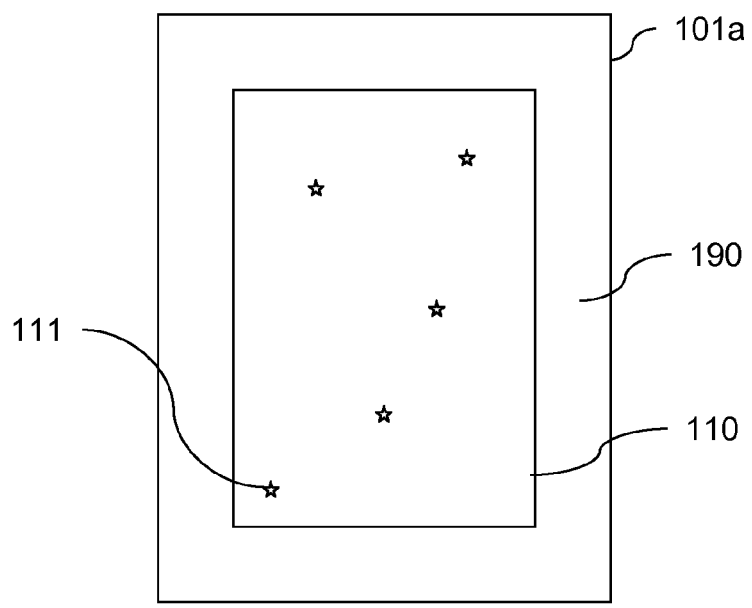
FIG. 4B is a schematic plan view of an EUV mask blank with defects for illustrating the embodiment of FIG. 4A.

FIGS. 4A to 4E refer to an embodiment mediating EUV mask blank defects by design adjustments. AN EUV mask blank 101a is inspected to obtain information about defects 111 in the EUV mask blank 101a. As shown in FIG. 4B, the EUV mask blank 101a includes a frame area 190 surrounding an image area 110 that corresponds to an exposure field. The size of the exposure field may be about 152×152 millimeter. Typically, buried defects may result from pits on a substrate surface on which a multilayer reflector is deposited, or particles or layer defects that get introduced either on the substrate surface or during deposition of the multilayer reflector. Some of the buried defects are printable. Typically, defects are considered printable if they lower the available process window for features in the vicinity of the buried defect by a significant degree, for example by 10%. In cases where the buried defects have positions directly below absorber patterns or have a sufficient distance to absorber patterns the defects usually do not print on a target. Printable defects may be repaired by correcting absorber patterns in the vicinity of the buried defect after providing an absorber pattern on the multilayer reflector.

Figure 4C:
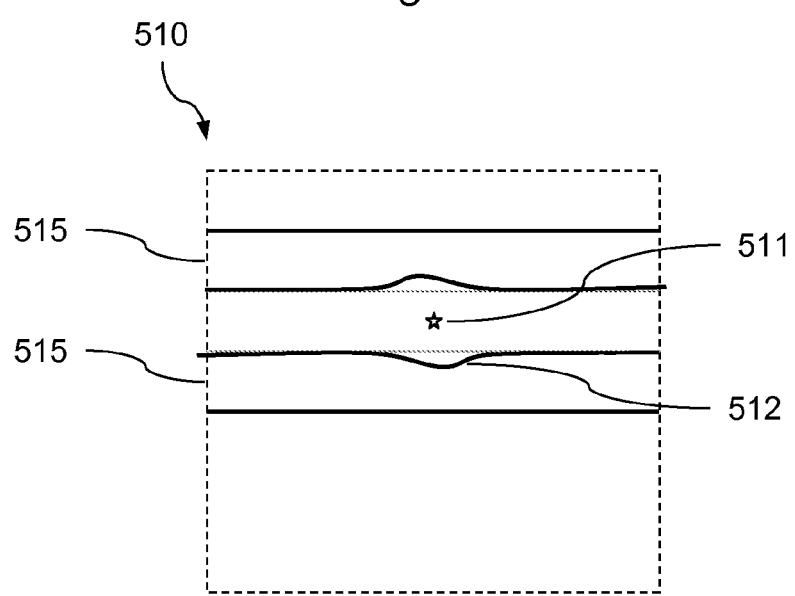
FIG. 4C is a schematic plan view of a section of an EUV mask including a defect for illustrating the effect of a defect between absorber lines.

FIG. 4C shows the effect of a mask defect 111 on printed lines 515 on a target, wherein the printed lines 515 correspond to absorber lines on the EUV mask 101. The image point 511 of the defect is between two lines 515 having a distance close to a critical dimension. According to the illustrated example, a defect 111 on the EUV mask 101 of FIG. 4B locally reduces the illumination radiation. Depending on whether the EUV sensitive layer on the target is a positive or negative resist, scallops 512 in such edges of the printed lines 515 may result that are oriented to the image point 511 of the buried defect 111 of the EUV mask 101.

The mask blank 101a is inspected using either an optical or and actinic method reviewing an actinic areal image. The information obtained from the inspection includes at least position information identifying the location of the buried defect on the EUV mask blank 101a. In addition, the information may include information about a local reflectivity change of the EUV mask blank 101a resulting from the respective defect 111. Referring back to FIG. 4A, inspection may be carried out using an inspection unit 610. In addition, information about the target design is provided.

Figure 4D:
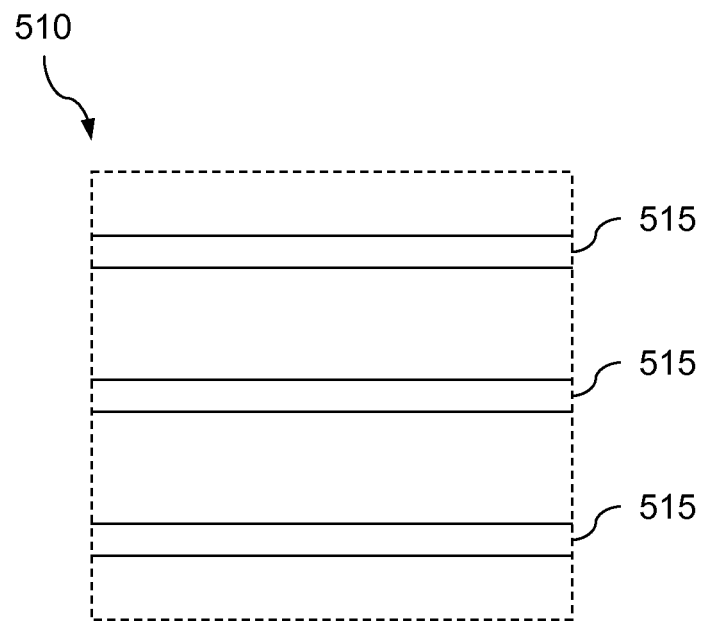
FIG. 4D is a schematic plan view of a section of a predefined mask pattern for illustrating effects of the embodiment of FIG. 4A.

As an example for a predefined mask pattern, FIG. 4D shows an arrangement of parallel lines 515 having a distance between each other close to a critical dimension. The effects of the defects in the EUV mask blank 101a on the predefined mask pattern are simulated and the predefined mask pattern is modified to compensate for the simulated effects of the defects. The modified design pattern is provided on the inspected EUV mask blank 101a.

Figure 4E:
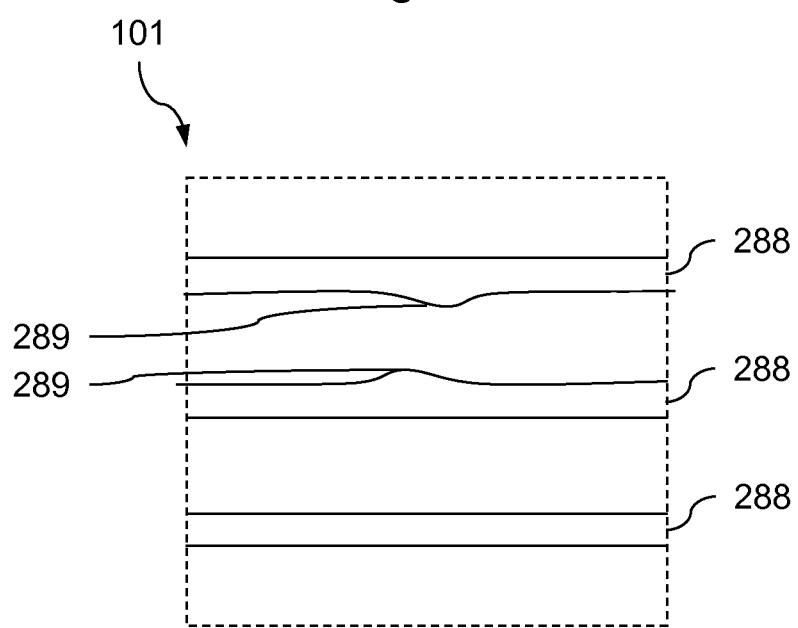
FIG. 4E is a schematic plan view of an EUV mask for illustrating effects of the embodiments.

FIG. 4E shows a modified mask pattern with absorber lines 288 corresponding to the lines 515 of FIG. 4D. Convex portions 289 of the absorber lines 288 extend into the direction of the defect image point 511 of FIG. 4C.

According to FIG. 4A, the modification of the predefined mask pattern may be performed at a computing unit 630, which modifies the predefined mask pattern on the basis of a set of rules. According to an embodiment, the computing unit 630 includes an editing station. The set of rules may include a rule providing widening neighbouring absorbing portions of the design pattern, if the defect is located in a multilayer reflector below a non-absorbing portion of the design pattern within a certain distance to the adjoining absorption structure. An electron beam apparatus 650 may be used to write the modified mask pattern on the mask blank 101a.

Figure 5A:
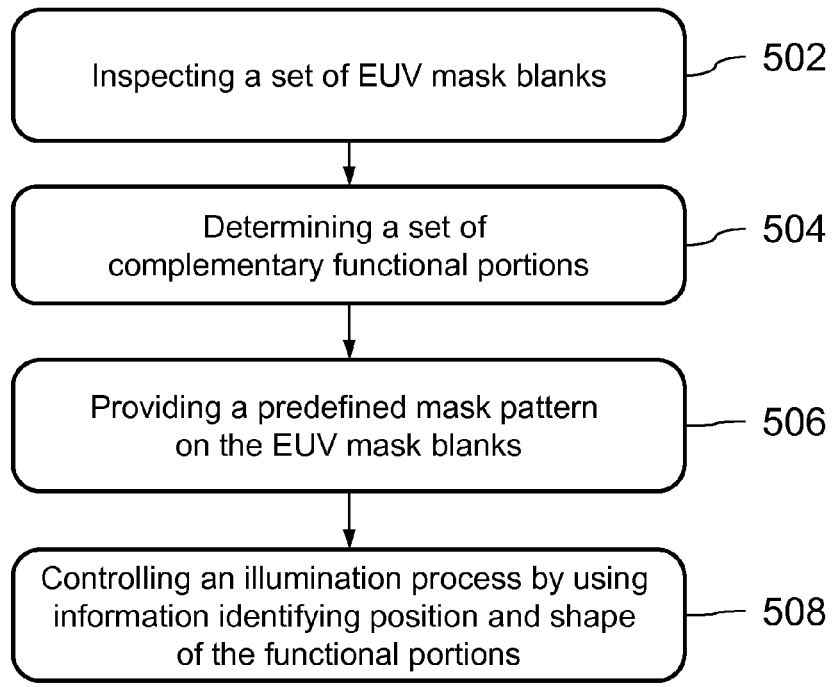
FIG. 5A is a simplified flowchart of a method of manufacturing an EUV mask set according to an embodiment.

FIG. 5A refers to a method of manufacturing an EUV mask set. A set of EUV mask blanks is inspected to obtain information about defects in each of the EUV mask blanks of the EUV mask blank set (502). From the obtained information, a set of complementary functional portions is determined, wherein each functional portion is assigned to one of the EUV mask blanks and does not contain any of the defects (504). The functional portions of the EUV mask blanks complement one another to form a virtual image area corresponding in size to image areas of the EUV mask blanks. A predefined mask pattern is provided on the EUV mask blanks (506). Information identifying position and shape of the functional portions is used to control an illumination process for imaging the predefined mask pattern onto a target (508).

Figure 5B:
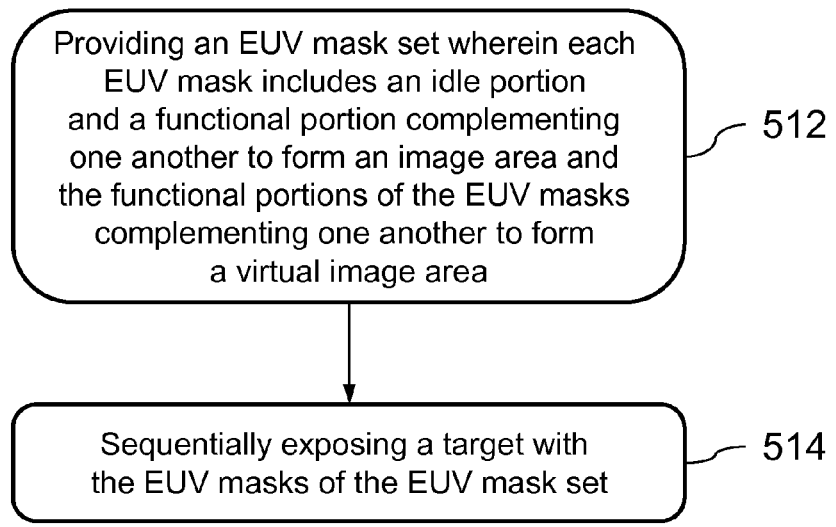
FIG. 5B is a simplified flowchart of a method of manufacturing an integrated circuit in accordance with an embodiment using a set of complementary EUV masks.

FIG. 5B refers to a method of manufacturing integrated circuits. An EUV mask set is provided, wherein each EUV mask of the EUV mask set comprises an idle portion and a functional portion which complement one another to form an image area (512). The functional portions of the EUV masks complement one another to form a virtual image area. Each of the functional portions includes a portion of a predefined mask pattern. The portions of the predefined mask pattern complement one another to form the predefined mask pattern. A target is sequentially exposed with the EUV masks of the EUV mask set (514), wherein the predefined mask pattern is imaged into an EUV sensitive layer provided on the target.

According to a further embodiment, a method of manufacturing an EUV mask includes inspecting an EUV mask blank to obtain information about defects in the EUV mask blank (522). The predefined design pattern is modified to compensate for the simulated effects of the defects (524). The modified design pattern is provided on the inspected EUV mask blank (526).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method of manufacturing an EUV mask set, the method comprising:
   inspecting a set of EUV mask blanks to obtain information about defects in each of the EUV mask blanks of the EUV mask blank set;
   determining, from the obtained information, a set of complementary functional portions, each functional portion being assigned to one of the EUV mask blanks and not containing any of the defects, the functional portions of the EUV mask blanks complementing one another to form a virtual image area corresponding in size to image areas of the EUV mask blanks;
   providing a predefined mask pattern on the EUV mask blanks; and
   using information identifying position and shape of the functional portions to control an illumination process for imaging the predefined mask pattern onto a target.

2. The method according to claim 1, comprising
   providing each of the EUV mask blanks with a portion of the predefined mask pattern in the respective functional portion, the portions of the predefined mask pattern of the EUV mask set complementing one another to form the predefined mask pattern.

3. The method according to claim 1, wherein
   the EUV mask set is a set of two EUV masks.

4. The method according to claim 1, wherein
   providing parting lines confining the functional portions from further portions of the respective image area are provided to run between mask portions assigned to different semiconductor dies.

5. The method according to claim 1, wherein
   providing parting lines confining the functional portions from further portions of the respective image area are provided to run between mask portions assigned to spatially separated pattern blocks.

6. The method according to claim 1, comprising:
   identifying, for each EUV mask blank, an idle portion, the idle and the functional portions of each EUV mask blank complementing one another to form the image area.

7. The method according to claim 6, comprising:
   providing the EUV mask blanks with an absorber pattern layer in the image areas, patterning the absorber layers in the functional portions and leaving the absorber layers unpatterned in the idle portions.

8. The method according to claim 1, wherein
   the information about defects includes positional information.

9. A method of manufacturing integrated circuits, the method comprising:
   providing an EUV mask set, each EUV mask of the EUV mask set comprising an idle portion and a functional portion complementing one another to form an image area, the functional portions of the EUV masks complementing one another to form a virtual image area, each of the functional portions including a portion of a predefined mask pattern and the portions of the predefined mask pattern complementing one another to form the predefined mask pattern,
   exposing, sequentially, a target with the EUV masks of the EUV mask set, wherein the predefined mask pattern is imaged into an EUV sensitive layer provided on the target.

10. The method according to claim 9, comprising:
    providing information about shape and position of the functional portions to an EUV lithographic apparatus using the EUV masks, and controlling exposure illumination such that the EUV masks are not illuminated by the EUV lithography apparatus outside the functional portions.

11. The method according to claim 9, comprising:
    providing information about shape and position of the functional portions to an EUV lithographic apparatus using the EUV masks, and controlling scanning of the EUV masks such that the EUV masks are not scanned by the EUV lithography apparatus outside the functional portions.

12. The method according to claim 9, comprising:
    covering each of the idle portions with a portion of an absorber layer.

13. The method according to claim 9, comprising:
    installing a first one of the EUV masks of the EUV mask set at an EUV lithography apparatus, performing a first exposure using the first one of the EUV masks, de-installing the first one of the EUV mask, installing a second one of the EUV masks of the EUV mask set at the EUV lithography apparatus, and performing a second exposure using the second one of the EUV masks.

14. An EUV mask set, wherein:
    each EUV mask of the EUV mask set comprises defects, an idle portion and a functional portion complementing one another to form an image area, each functional portion including a portion of a predefined mask pattern, the portions of the predefined mask pattern of the EUV mask set complementing one another to form the predefined mask pattern and each functional portion being free of defects printing on a target.

15. The EUV mask set according to claim 14, wherein
    the EUV mask set is a set of two EUV masks.

16. The EUV mask set according to claim 14, wherein
    a portion of an absorber layer covers the idle portions.

17. The EUV mask set according to claim 14, wherein
    parting lines between the idle portions and the functional portions run between edges of functional units of integrated circuits obtained by exposing a semiconductor substrate using the EUV masks.

18. The EUV mask set according to claim 14, wherein
    parting lines between the idle portions and the functional portions run within mask sections corresponding to kerf lines separating semiconductor dies of integrated circuits obtained by exposing a semiconductor substrate using the EUV masks.

19. The EUV mask set according to claim 14, wherein
    parting lines between the idle portions and the functional portions run between spatially separated pattern blocks.

20. The EUV mask set according to claim 14, wherein
    parting lines between the idle portions and the functional portions run along two orthogonal directions.

* * * * *